(12) United States Patent
Umemoto et al.

(10) Patent No.: US 10,002,950 B1
(45) Date of Patent: Jun. 19, 2018

(54) BIPOLAR TRANSISTOR AND METHOD FOR PRODUCING THE SAME

(71) Applicant: MURATA MANUFACTURING CO., LTD., Kyoto-fu (JP)

(72) Inventors: Yasunari Umemoto, Nagaokakyo (JP); Shigeki Koya, Nagaokakyo (JP); Atsushi Kurokawa, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days. days.

(21) Appl. No.: 15/694,111

(22) Filed: Sep. 1, 2017

(30) Foreign Application Priority Data

Dec. 19, 2016 (JP) .................................. 2016-245282

(51) Int. Cl.
| H01L 21/00 | (2006.01) |
| H01L 29/737 | (2006.01) |
| H01L 29/66 | (2006.01) |
| H01L 29/36 | (2006.01) |
| H01L 29/205 | (2006.01) |
| H01L 29/08 | (2006.01) |
| H01L 29/10 | (2006.01) |
| H01L 29/06 | (2006.01) |
| H01L 21/306 | (2006.01) |

(52) U.S. Cl.
CPC ...... *H01L 29/7371* (2013.01); *H01L 29/0684* (2013.01); *H01L 29/0817* (2013.01); *H01L 29/0821* (2013.01); *H01L 29/1004* (2013.01); *H01L 29/205* (2013.01); *H01L 29/36* (2013.01); *H01L 29/66318* (2013.01); *H01L 21/30612* (2013.01)

(58) Field of Classification Search
CPC .. H01L 29/7371; H01L 29/36; H01L 29/0817
See application file for complete search history.

(56) References Cited

U.S. PATENT DOCUMENTS

| 7,064,416 | B2* | 6/2006 | Dunn | H01L 21/8249 257/566 |
| 7,190,047 | B2* | 3/2007 | Chen | H01L 29/66242 257/586 |
| 7,303,968 | B2* | 12/2007 | Dunn | H01L 21/8249 257/565 |
| 7,566,948 | B2* | 7/2009 | Rehder | H01L 29/1004 257/592 |
| 9,397,204 | B2* | 7/2016 | Obu | H01L 29/41758 |

(Continued)

FOREIGN PATENT DOCUMENTS

| JP | 2006-060221 A | 3/2006 |
| JP | 2008-130586 A | 6/2008 |
| JP | 2010-183054 A | 8/2010 |

*Primary Examiner* — Laura Menz
(74) *Attorney, Agent, or Firm* — Studebaker & Brackett PC (57) ABSTRACT

A bipolar transistor has a subcollector layer and a stack of collector, base, and emitter layers on the subcollector layer. On the subcollector layer are collector electrodes. On the base layer are base electrodes. The collector layer includes multiple doped layers with graded impurity concentrations, higher on the subcollector layer side and lower on the base layer side. Of these doped layers, the one having the highest impurity concentration is in contact with the subcollector layer and has a sheet resistance less than or equal to about nine times that of the subcollector layer.

13 Claims, 12 Drawing Sheets

(56) References Cited

U.S. PATENT DOCUMENTS

| | | | |
|---|---|---|---|
| 2003/0094673 A1* | 5/2003 | Dunn | H01L 21/8249 |
| | | | 257/566 |
| 2004/0065897 A1 | 4/2004 | Lee et al. | |
| 2005/0269594 A1* | 12/2005 | Chen | H01L 29/66242 |
| | | | 257/183 |
| 2006/0157824 A1* | 7/2006 | Dunn | H01L 21/8249 |
| | | | 257/566 |
| 2012/0326211 A1* | 12/2012 | Stevens | H01L 21/8252 |
| | | | 257/195 |
| 2013/0285120 A1 | 10/2013 | Zampardi, Jr. | |
| 2013/0334570 A1 | 12/2013 | Lin et al. | |
| 2016/0005841 A1* | 1/2016 | Obu | H01L 29/41758 |
| | | | 257/190 |
| 2016/0049502 A1* | 2/2016 | Chin | H01L 29/7371 |
| | | | 257/22 |
| 2016/0133732 A1* | 5/2016 | Umemoto | H01L 29/0817 |
| | | | 257/197 |

* cited by examiner

BIPOLAR TRANSISTOR AND METHOD FOR PRODUCING THE SAME

CROSS REFERENCE TO RELATED APPLICATIONS

This application claims benefit of priority to Japanese Patent Application 2016-245282 filed Dec. 19, 2016, the entire content of which is incorporated herein by reference.

TECHNICAL FIELD

The present disclosure relates to a bipolar transistor and a method for producing the same.

BACKGROUND

In modern mobile communication terminals, heterojunction bipolar transistors (HBT) are commonly used as a component of a radio-frequency amplifier module. HBTs are generally expected to meet the performance requirements of, for example, high efficiency, high gain, high breakdown voltage (high ruggedness upon load mismatch), and high output power. For use in second-generation cellular phones, HBTs with high ruggedness upon load mismatch are still in strong demand, but recently there has also been a need for HBTs with higher output power. For use in third- and fourth-generation cellular phones, not only HBTs with high power added efficiency but also ones with higher efficiency, high gain, and high output power are in demand. These trends indicate a growing need for higher outputpower HBTs in recent years.

Japanese Unexamined Patent Application Publication Nos. 2006-60221 and 2008-130586 disclose high output-power HBTs, mentioning their structure. These HBTs have a substrate and a stack of subcollector, collector, base, and emitter layers on the substrate. The subcollector and collector layers serve as an n-type collector region, the base layer as a p-type base region, and the emitter layer as an n-type emitter region. The collector layer is a stack of multiple doped layers with graded donor-impurity concentrations, higher on the subcollector layer side and lower on the base layer side. The portion of the emitter region through which the emitter current actually flows is referred to as an intrinsic emitter region. In the base and collector regions, too, the current flows through the portions lying beneath the intrinsic emitter region. The structure formed by the intrinsic emitter region and the portions of the base and collector regions lying therebeneath is referred to as an intrinsic HBT.

The HBT illustrated in FIG. 1A of Japanese Unexamined Patent Application Publication No. 2006-60221 has a collector layer that includes first, second, and third n-type doped layers, from the closest to a subcollector layer. The first n-type doped layer has an impurity concentration of $7 \times 10^{16}$ cm$^{-3}$ or more and $10 \times 10^{16}$ cm$^{-3}$ or less and a thickness of 200 nm or more and 400 nm or less. The second n-type doped layer has an impurity concentration of $4 \times 10^{16}$ cm$^{-3}$ or more and $7 \times 10^{16}$ cm$^{-3}$ or less and a thickness of 200 nm or more and 400 nm or less. The third n-type doped layer has an impurity concentration of $0.5 \times 10^{16}$ cm$^{-3}$ or more and $4 \times 10^{16}$ cm$^{-3}$ or less and a thickness of 100 nm or more and 500 nm or less. The subcollector layer has an impurity concentration of $4 \times 10^{18}$ cm$^{-3}$ and a thickness of 400 nm.

In the HBT illustrated in FIG. 1C of Japanese Unexamined Patent Application Publication No. 2006-60221, the collector layer has first, second, third, and fourth n-type doped layers, from the closest to a subcollector layer. The first n-type doped layer has an impurity concentration of $7 \times 10^{16}$ cm$^{-3}$ or more and $10 \times 10^{16}$ cm$^{-3}$ or less and a thickness of 200 nm or more and 400 nm or less. The second n-type doped layer has an impurity concentration of $4 \times 10^{16}$ cm$^{-3}$ or more and $7 \times 10^{16}$ cm$^{-3}$ or less and a thickness of 200 nm or more and 400 nm or less. The third n-type doped layer has an impurity concentration of $0.5 \times 10^{16}$ cm$^{-3}$ or more and $4 \times 10^{16}$ cm$^{-3}$ or less and a thickness of 100 nm or more and 500 nm or less. The fourth n-type doped layer has an impurity concentration of $0.84 \times 10^{16}$ cm$^{-3}$ or more and $4 \times 10^{16}$ cm$^{-3}$ or less and a thickness of 100 nm or more and 500 nm or less. The subcollector layer has an impurity concentration of $4 \times 10^{18}$ cm$^{-3}$ and a thickness of 400 nm.

In the HBT illustrated in FIG. 20 of Japanese Unexamined Patent Application Publication No. 2008-130586, the collector layer has first, second, and third n-type doped layers, from the closest to a subcollector layer. The first n-type doped layer has an impurity concentration of $5 \times 10^{16}$ cm$^{-3}$ and a thickness of 200 nm. The second n-type doped layer has an impurity concentration of $1 \times 10^{16}$ cm$^{-3}$ and a thickness of 200 nm. The third n-type doped layer has an impurity concentration of $5 \times 10^{15}$ cm$^{-3}$ and a thickness of 600 nm. The subcollector layer presumably has an impurity concentration of $1 \times 10^{18}$ cm$^{-3}$, although this is speculation based on a description in an Example in the disclosure.

As can be seen, in these HBTs, the subcollector layer has a high impurity concentration, at least $1 \times 10^{18}$ cm$^{-3}$. In the fabrication of an HBT, it is a common practice to dope the subcollector layer to the highest technically possible impurity concentration at the moment to minimize the collector resistance Rc, between the ends of the collector electrodes and the center of the collector layer. The collector layer is usually doped to a relatively low concentration, ⅒ or less of that in the subcollector layer, for two purposes. One is to prevent the base-collector capacitance from being too great, which would affect the efficiency, gain, and other radio-frequency characteristics of the HBT, and the other to prevent the base-collector and collector-emitter breakdown voltages from being too low, which would cause the HBT to be broken when operated to full radio-frequency power, in which its output voltage amplitude peaks.

Figure 11:
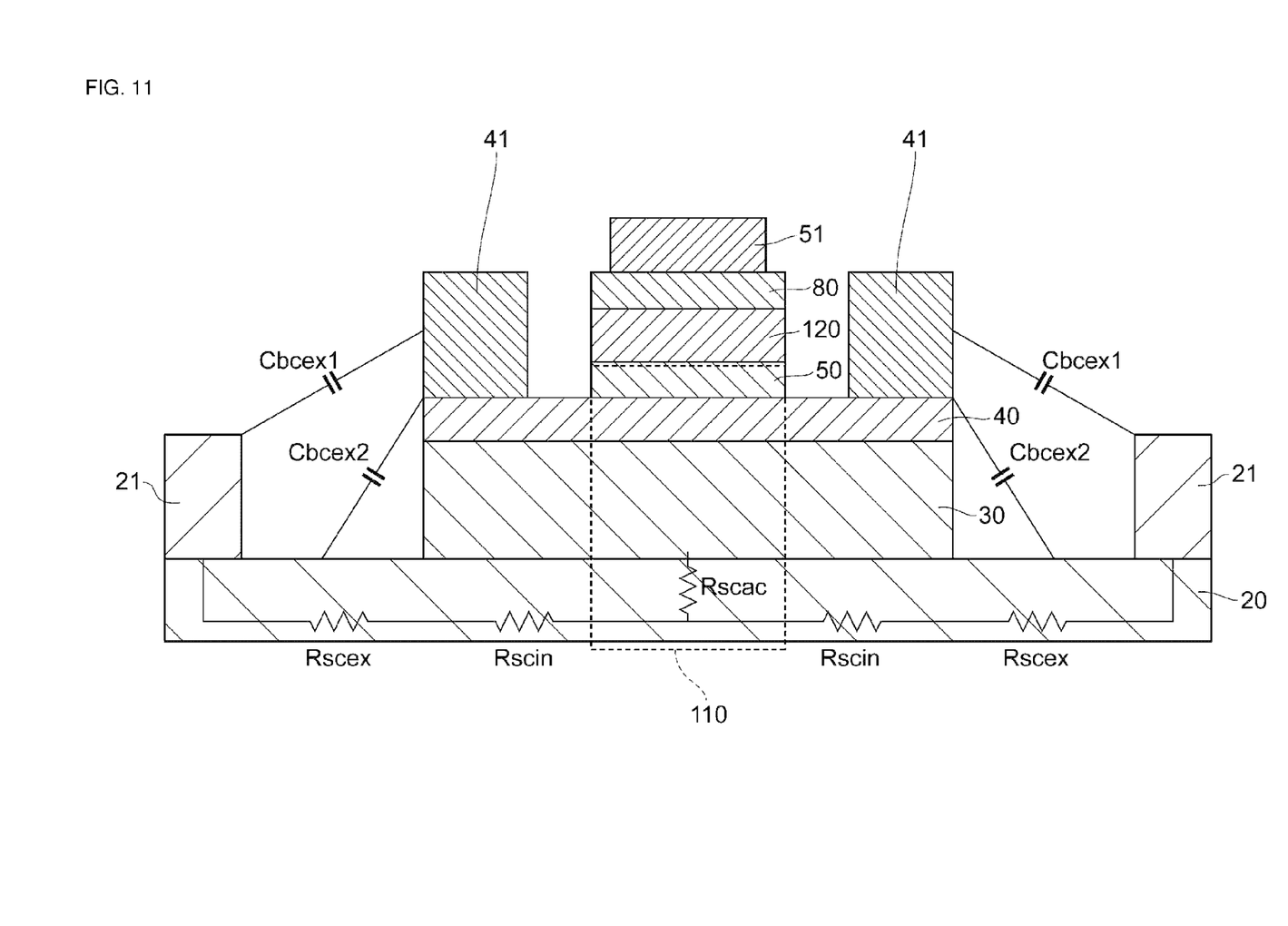
FIG. 11 is a cross-sectional view of the structure of a known bipolar transistor.
Figure 12:
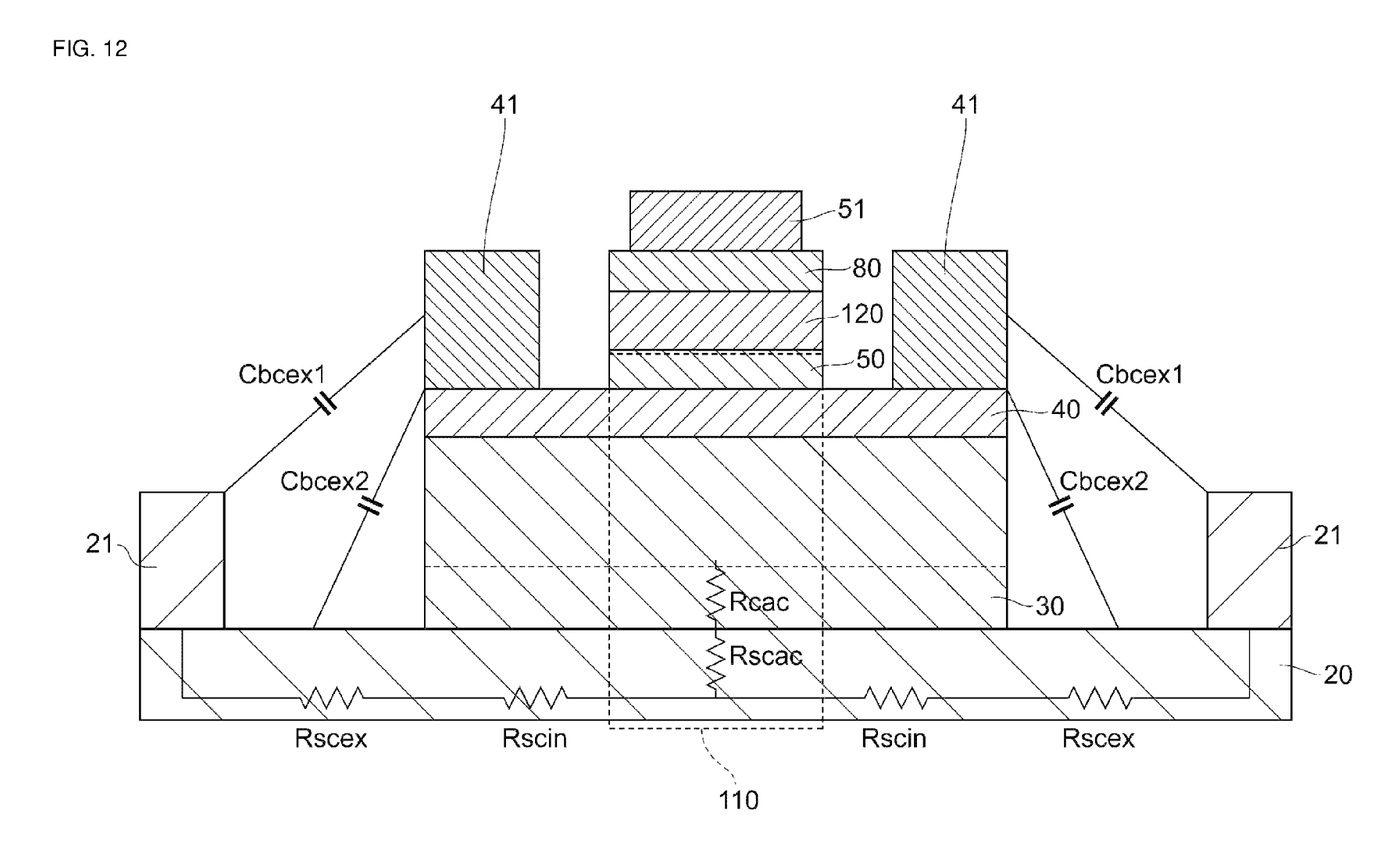
FIG. 12 is a cross-sectional view of the structure of a known bipolar transistor.

Increasing the output power of an HBT requires reducing both collector resistance and base-collector capacitance of the HBT. With the known technologies, however, it is difficult to increase the output power of an HBT by reducing both collector resistance and base-collector capacitance of the HBT. The following describes the reason with reference to FIGS. 11 and 12. FIGS. 11 and 12 illustrate known HBTs each having a subcollector layer 20, a collector layer 30, a base layer 40, an emitter layer 50, an intrinsic HBT 110, a capping layer 120, a contact layer 80, an emitter electrode 51, collector electrodes 21, and base electrodes 41.

As illustrated in FIGS. 11 and 12, the collector layer of the known HBTs has a multilayer structure, and this structure helps give the HBTs the desired base-collector, collector-emitter, and on-state breakdown voltages. The impurity concentration and thickness (typically, concentration distribution) of each doped layer constituting the collector layer 30 determine these breakdown voltages. The total thickness of the doped layers constituting the collector layer 30, however, has been disregarded, and some known HBTs have a collector layer 30 thicker than necessary for the desired breakdown voltages. The base-collector capacitance Cbc of a known HBT is composed of a depletion layer capacitance Cbcd, external capacitances Cbcex1, and external capacitances Cbcex2. The depletion layer capacitance Cbcd is formed between the base layer 40 and the collector layer 30, the external capacitances Cbcex1 between the base electrodes 41 and base layer 40 and the collector electrodes 21, and the external capacitances Cbcex2 between the base electrodes 41 and base layer 40 and the subcollector layer 20. The depletion layer capacitance Cbcd makes a relatively large contribution, but the other two types of external capacitances, Cbcex1 and Cbcex2, also make non-negligible contributions.

If the collector layer 30 has the smallest thickness necessary for the desired breakdown voltages, the base electrodes 41 and base layer 40 are close to the collector electrodes 21 and subcollector layer 20, as in FIG. 11. This means that the external capacitances Cbcex1, formed between the base electrodes 41 and base layer 40 and the collector electrodes 21, are large, and so are the external capacitances Cbcex2, formed between the base electrodes 41 and base layer 40 and the subcollector layer 20. As a result, the output power, and therefore the gain and efficiency, of the HBT are low.

Making the collector layer 30 thicker than necessary for the desired breakdown voltages is a way to avoid such large external capacitances Cbcex1 and Cbcex2. This, however, causes the problem of a large access resistance of the collector layer 30, a layer having a lower impurity concentration (about 1/10) than the subcollector layer 20. For better understanding of this problem, the following describes some major resistance components that contribute to the collector resistance Rc of a known HBT with reference to FIG. 12. The contact resistance between the collector electrodes 21 and the subcollector layer and the resistance of the collector electrodes are not illustrated. In the drawing, the resistance components contributing to the collector resistance Rc are expressed in a lumped element circuit for brevity, although it would be technically more accurate to use a distributed element circuit.

The collector resistance Rc is composed of external subcollector resistances Rscex, internal subcollector resistances Rscin, and access resistances Rscac and Rcac. The external subcollector resistances Rscex are the resistances the subcollector layer 20 has in the areas from the ends of the collector electrodes 21 to the ends of the collector layer 30. The inner subcollector resistances Rscin are the resistances the subcollector layer 20 has in the areas beneath the collector layer 30. The access resistance Rscac is the resistance to current flowing from the subcollector layer 20 to the active region of the intrinsic HBT 110. The access resistance Rcac is the resistance to current flowing from the subcollector layer 20 to the region of the smallest thickness necessary for the desired breakdown voltages. The sum of an external subcollector resistance Rscex and an inner subcollector resistance Rscin, referred to as an (Rscex+Rscin) resistance, has a width equal to the thickness of the subcollector layer 20 (typically between about 0.5 μm and about 1.5 μm) and a length equal to the horizontal distance between the end of a collector electrode 21 to the center of the intrinsic HBT 110 (typically between about 2 μm and about 4 μm).

The access resistance Rscac has the same width as the intrinsic HBT 110 (typically between about 2 μm and about 6 μm) and the same length as the subcollector layer 20 (typically between about 0.5 μm and about 1.5 μm). The contribution of the access resistance Rscac is therefore negligible compared with that of the (Rscex+Rscin) resistances. The contribution of the access resistance Rcac, however, cannot be ignored, because the access resistance Rcac, although identical in width to the intrinsic HBT 110 (typically between about 2 μm and about 6 μm), extends over a length of about 0.3 μm to about 0.7 μm in the collector layer 30, in which the impurity concentration is 1/10 or less of that in the subcollector layer 20. It should be understood that the length and width of a resistance as mentioned herein refer to the lengths of the resistance as measured parallel and perpendicular, respectively, to the direction of the flow of current.

The collector resistance Rc is therefore given by (Rscex+ Rscin)/2+Rcac. This means that if the collector layer 30 is thicker than necessary for the desired breakdown voltages, the access resistance Rcac, the resistance to current flowing from the subcollector layer 20 to the active region of the intrinsic HBT 110, is accordingly large, and so is the overall collector resistance Rc. As a result, the on-state resistance Ron of the HBT cannot be lower than a certain limit, capping the output power of the HBT. Because of this tradeoff between the external capacitances Cbcex1 and Cbcex2 and the collector resistance Rc, it is difficult to increase the output power of an HBT by reducing both of them, as long as the known structure continues being used.

SUMMARY

Accordingly, it is an object of the present disclosure to increase the output power of a bipolar transistor by reducing both collector resistance and base-collector capacitance of the transistor.

According to preferred embodiments of the present disclosure, a bipolar transistor includes (i) a subcollector layer having first and second surfaces on opposite sides and collector electrodes on the first surface, (ii) a base layer having third and fourth surfaces on opposite sides and base electrodes on the third surface, (iii) a collector layer having fifth and sixth surfaces on opposite sides, with the fifth and sixth surfaces in contact with the fourth and first surfaces, respectively, and including multiple doped layers with graded impurity concentrations, higher on the sixth surface side and lower on the fifth surface side, and (iv) an emitter layer on the third surface. The multiple doped layers include a first doped layer that has the highest impurity concentration thereamong and is in contact with the first surface. The first doped layer has a sheet resistance less than or equal to about 9 times that of the subcollector layer.

Other features, elements, characteristics and advantages of the present disclosure will become more apparent from the following detailed description of preferred embodiments of the present disclosure with reference to the attached drawings.

DETAILED DESCRIPTION

The following describes some embodiments of the present disclosure with reference to the drawings. Like elements are given like numerals throughout and described only once in the following.

Figure 1:
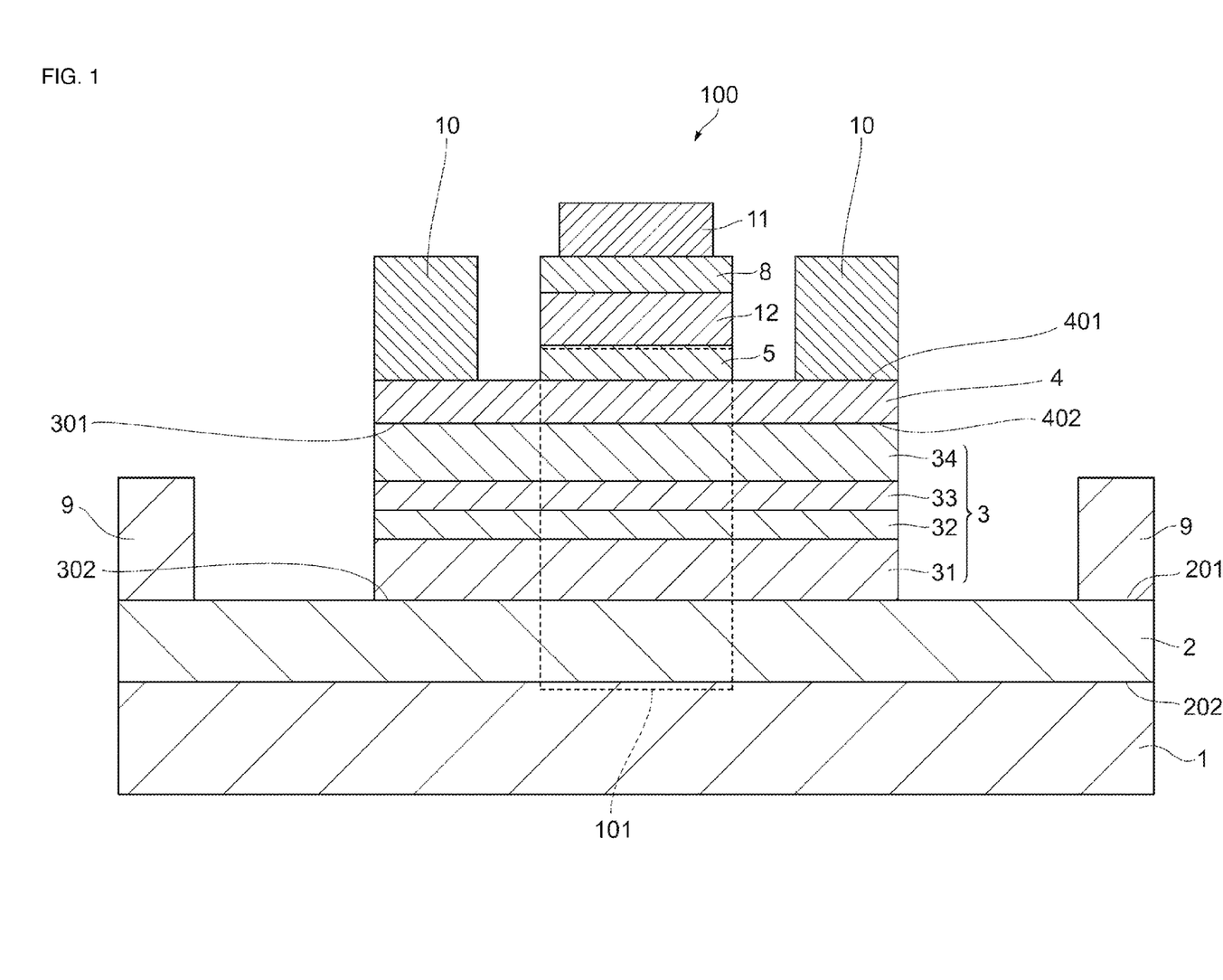
FIG. 1 is a cross-sectional view of the structure of a bipolar transistor according to an embodiment of the present disclosure.

FIG. 1 is a cross-sectional view of the structure of a bipolar transistor 100 according to an embodiment of the present disclosure. The bipolar transistor 100 includes a subcollector layer 2, a collector layer 3, a base layer 4, and an emitter layer 5, each being a layer of a compound semiconductor. The subcollector layer 2 has two principal surfaces, one of which is referred to as the first surface 201 and the other as the second surface 202. The second surface 202 is on the side opposite the first surface 201. On the first surface 201, of the subcollector layer 2, are collector electrodes 9. The subcollector layer 2 is on a substrate 1, with the second surface 202 in contact with the substrate 1. The base layer 4 also has two principal surfaces, one of which is referred to as the third surface 401 and the other as the fourth surface 402. The fourth surface 402 is on the side opposite the third surface 401. On the third surface 401 are the emitter layer 5 and base electrodes 10. The collector layer 3 also has two principal surfaces, one of which is referred to as the fifth surface 301 and the other as the sixth surface 302. The sixth surface 302 is on the side opposite the fifth surface 301, with the fifth surface 301 in contact with the fourth surface 402 and the sixth surface 302 in contact with the first surface 201. The collector layer 3 includes multiple doped layers 31, 32, 33, and with graded impurity concentrations, higher on the sixth surface 302 side and lower on the fifth surface 301 side. The doped layers 31, 32, 33, and 34 are stacked in this order on the subcollector layer 2 and referred to as the first, second, third, and fourth doped layers, respectively. These doped layers vary in impurity concentration but are of the same material. On the emitter layer 5 is a stack of a capping layer 12, a contact layer 8, and an emitter electrode 11.

The bipolar transistor 100 is, for example, a hetero-bipolar transistor, in which the emitter layer 5 and the base layer 4 form a heterojunction and the emitter layer 5 has a band gap greater than that of the base layer 4. The heterojunction reduces the base resistance, improving the radio-frequency characteristics of the bipolar transistor 100. Furthermore, the compound semiconductors give the bipolar transistor 100 high electron mobility. The region 101 is referred to as an intrinsic HBT.

Figure 2:
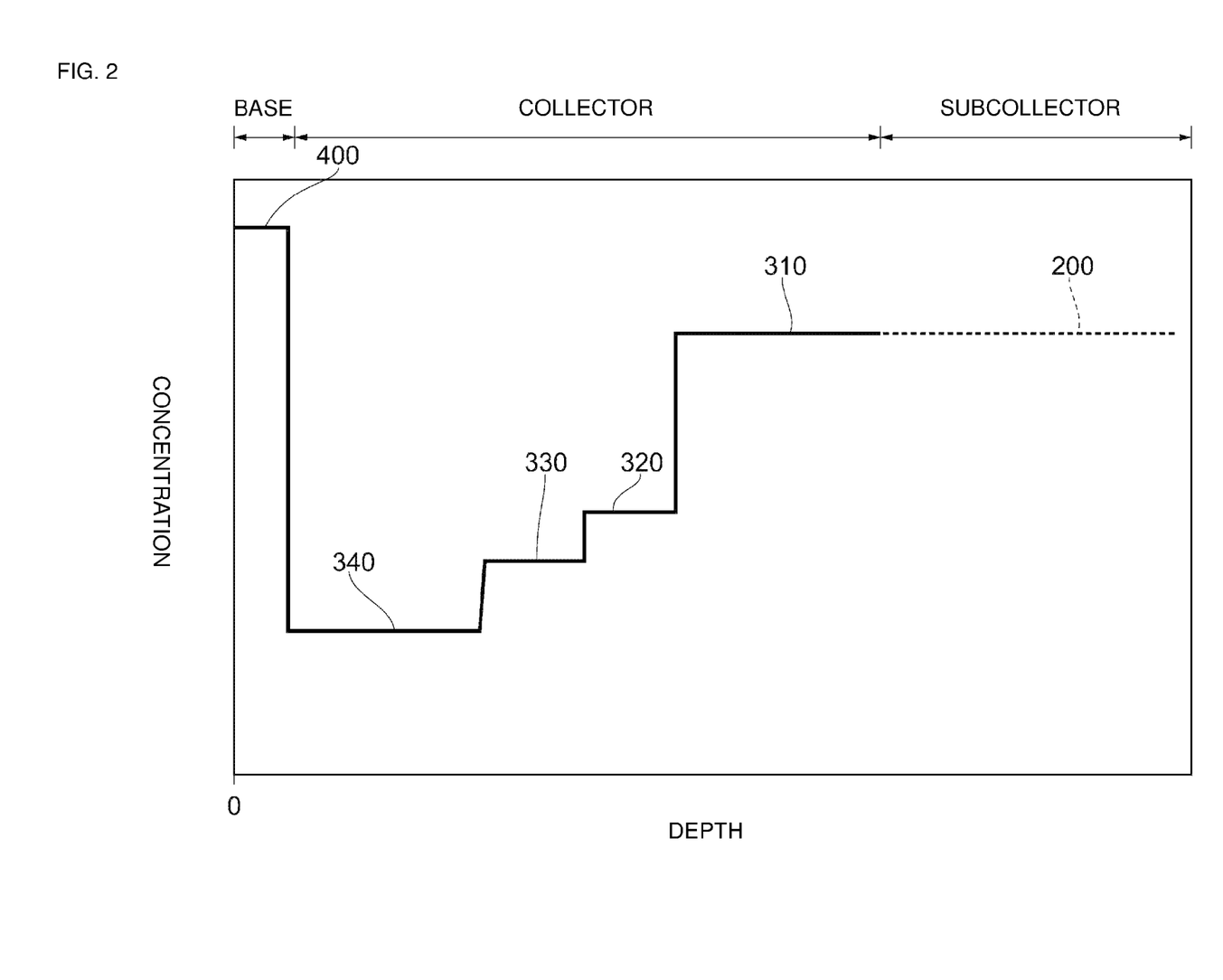
FIG. 2 graphically represents the distribution of impurity concentrations in some layers of a bipolar transistor according to an embodiment of the present disclosure.

FIG. 2 graphically represents the distribution of impurity concentrations in some layers of the bipolar transistor 100. In FIG. 2, the horizontal axis is for depth in the direction from the third surface 401, of the base layer 4, to the first surface 201, of the subcollector layer 2, and the vertical axis for the impurity concentration in each layer. The segments 200, 310, 320, 330, 340, and 400 correspond to the distributions of impurity concentrations in the subcollector layer 2, first doped layer 31, second doped layer 32, third doped layer 33, fourth doped layer 34, and base layer 4, respectively. The doped layers 31, 32, 33, and 34 have a first type of conductivity, and the base layer 4 has a second type of conductivity, opposite the first. For example, when the first type of conductivity is n-type, the second is p-type. When the first type of conductivity is p-type, for example, the second is n-type. As illustrated, the first doped layer 31 has the highest impurity concentration among the multiple doped layers 31, 32, 33, and 34. The impurity concentration in the second doped layer 32 is the second highest, and that in the third doped layer 33 is the third highest. In the fourth doped layer 34, the impurity concentration is the lowest. The impurity concentration in the first doped layer 31 and that in the subcollector layer 2 may be the same or different.

Preferably, the impurity concentration in the subcollector layer 2 is about $1 \times 10^{18}$ $cm^{-3}$ or more. Doping the subcollector layer 2 to a high concentration will reduce the collector resistance Rc of the bipolar transistor 100, increasing the output power of the bipolar transistor 100.

Desirably, each of the second, third, and fourth doped layers 32, 33, and 34 has an impurity concentration at least about an order of magnitude smaller than that in the first doped layer 31. This improves the base-collector and collector-emitter breakdown voltages, ensuring the bipolar transistor 100 is not broken even when operated to full output power.

For the second and third doped layers 32 and 33, it is preferred that the impurity concentration be about $1 \times 10^{16}$ $cm^{-3}$ or more and about $7 \times 10^{18}$ $cm^{-3}$ or less. For the fourth doped layer 34, it is preferred that the impurity concentration be about $3 \times 10^{15}$ $cm^{-3}$ or less. Under such conditions, increasing the collector voltage Vc makes the base-collector depletion layer rapidly expand within the fourth doped layer 34, owing to the impurity concentration in the fourth doped layer 34 much lower than those in the second and third doped layers 32 and 33. At a certain low voltage Vca within the saturation region of the bipolar transistor 100, the base-collector depletion layer reaches the boundary between the third and fourth doped layers 33 and 34. In the third doped layer 33, however, the expansion of the base-collector depletion layer at collector voltages Vc higher than or equal to Vca is limited because of the impurity concentration higher than that in the fourth doped layer 34. This means that at collector voltages Vc higher than or equal to Vca, the collector-voltage dependence of the base-collector capacitance Cbc is limited, and the linearity of the base-collector capacitance Cbc is improved. In this way, this adjustment of impurity concentrations makes the bipolar transistor 100 suitable for the application of RF (radio-frequency) signals for those telecommunication standards that require high linearity, such as WCDMA® (Wideband Code Division Multiple Access) and LTE (Long Term Evolution).

Preferably, the impurity concentration in the second doped layer 32 is higher than that in the third doped layer 33. This makes the access resistance R2cac in the second doped layer lower than it is when the second and third doped layers 32 and 33 have the same impurity concentration. The decrease in the access resistance R2cac leads to a decrease in the overall collector resistance Rc of the bipolar transistor 100. The on-state resistance of the bipolar transistor 100 is reduced, and, as a result, the output power of the bipolar transistor 100 is increased. Doping the second doped layer 32 to a high concentration, furthermore, will reduce the loss of on-state breakdown voltage where a large amount of current flows through the bipolar transistor 100, ensuring that even if the load changes when the bipolar transistor 100 is operated to full output power, the collector breakdown voltage upon load mismatch, determined by the on-state breakdown voltage, decreases only to a limited extent.

In each of the doped layers 31, 32, 33, and 34, the impurity concentration does not need to be uniform and may have a gradient. The number of doped layers constituting the collector layer 3 does not need to be four and can be two, three, five, or more.

Figure 3:
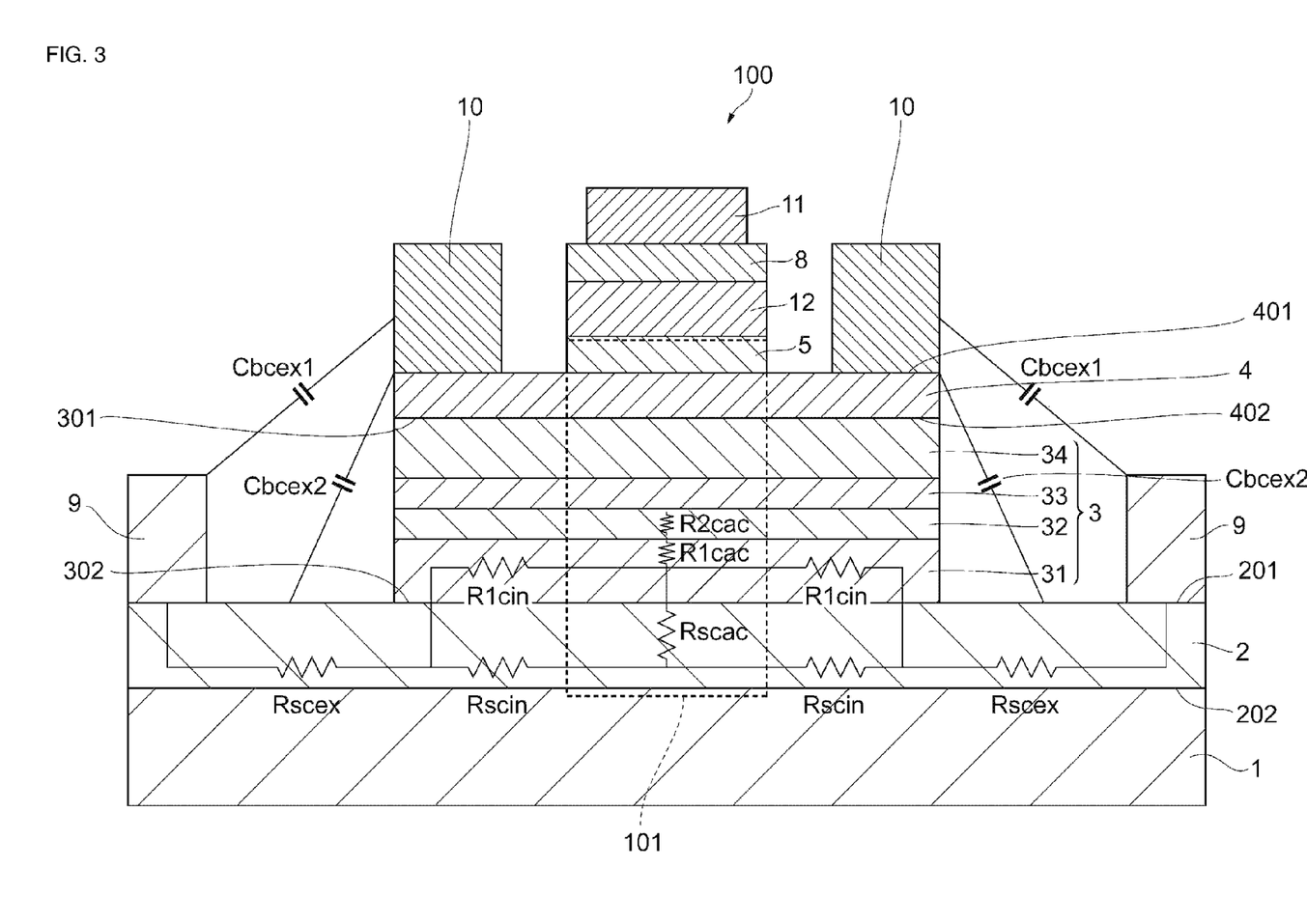
FIG. 3 illustrates the components of the collector resistance of a bipolar transistor according to an embodiment of the present disclosure.

FIG. 3 illustrates the components of the collector resistance Rc of the bipolar transistor 100. The first doped layer 31 has an impurity concentration and thickness similar to those of the subcollector layer 2 and extends beyond the boundary that separates the intrinsic HBT 101 from the outside. The first doped layer 31 therefore behaves as if it is a low-resistance current path, which is not present in an HBT in the known structure. Each of the resistance components the first doped layer 31 has is denoted by R1$cin$. Since each resistance component R1$cin$ is connected in parallel to an internal subcollector resistance component Rscin, which lies in the subcollector layer 2, the collector resistance Rc is equal to (Rscex+Rscin//R1$cin$)/2, where Rscin//R1$cin$=(Rscin×R1$cin$)/(Rscin+R1$cin$). The contribution of Rscac is again negligible compared with that of Rscex+Rscin//R1$cin$, and so is that of R1$cac$, for the reason described above. R2$cac$, in FIG. 3, is inside the thickness required to achieve the desired breakdown voltages. It does not need to be discussed and can be ignored.

The term "similar" as used in expressions like "A is similar to B" herein means that values A and B expressed as powers of ten have the same exponent value. For example, when the value B is about $\frac{1}{10}$ or more and about 9 times or less the value A, the values A and B can be deemed as similar.

Rscin//R1$cin$<Rscin, and Rscac and R1$cac$ are negligible. The collector resistance Rc in this embodiment, (Rscex+Rscin//R1$cin$)/2, is therefore always smaller than that in the known structure, (Rscex+Rscin)/2+Rcac. Since the first doped layer 31 has an impurity concentration and thickness similar to those of the subcollector layer 2, the bipolar transistor 100 has a structure in which the subcollector layer 2 and the first doped layer 31 are connected in parallel. This parallel connection reduces the collector resistance Rc. In an HBT in the known structure, the doped layer corresponding to the first doped layer 31 has a low impurity concentration compared with the subcollector layer, and, therefore, the resistance components in the subcollector layer predominantly determine the collector resistance. Hence it is difficult to reduce the collector resistance of an HBT in the known structure.

Figure 4:
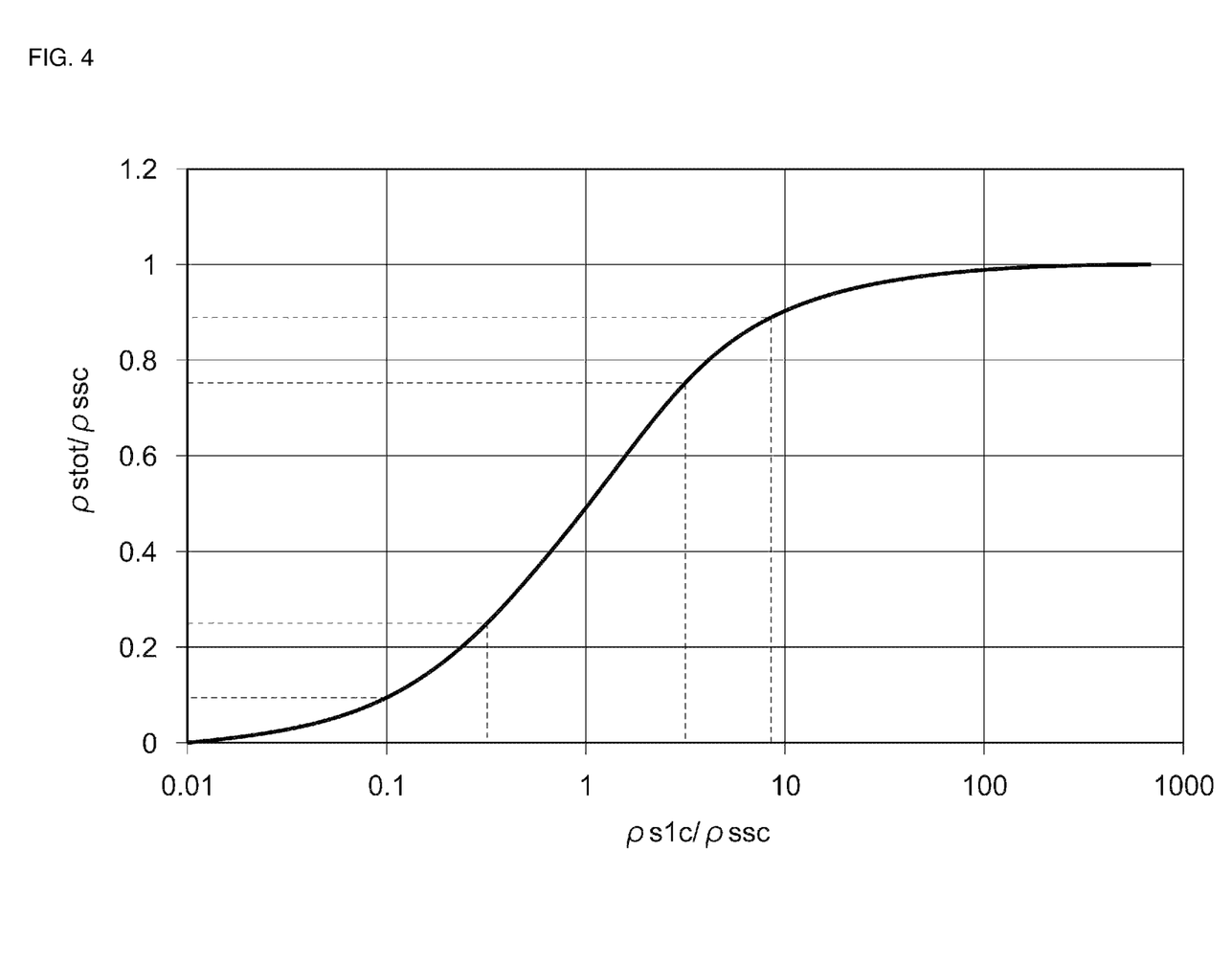
FIG. 4 graphically represents the relationship between ρslc/ρssc and ρstot/ρssc of a bipolar transistor according to an embodiment of the present disclosure.

The sheet resistance of the subcollector layer 2 is denoted by ρssc, that of the first doped layer 31 by ρs1$c$, and the total sheet resistance of the subcollector layer 2 and the first doped layer 31, connected in parallel, by ρstot. FIG. 4 graphically represents the relationship between ρs1$c$/ρssc and ρstot/ρssc of a bipolar transistor 100 according to this embodiment. As the graph indicates, ρstot/ρssc is asymptotic to 1 at sufficiently high ρs1$c$/ρssc ratios, about 0.9 at a ρs1$c$/ρssc of about 9, and sharply drops at lower ρs1$c$/ρssc ratios. This means that bringing down ρs1$c$/ρssc to about 9 or less is effective in reducing the collector resistance Rc. At sufficiently low ρs1$c$/ρssc ratios, ρstot/ρssc is asymptotic to 0. Given the modest decrease, from about 0.1 to about 0, in ρstot/ρssc within the range of ρs1$c$/ρssc less than about $\frac{1}{10}$, ρs1$c$/ρssc values lower than about 0.1 have little effect in reducing the collector resistance Rc. Since such low ρs1$c$/ρssc ratios are also technically difficult to achieve, it is preferred that ρs1$c$/ρssc be about $\frac{1}{10}$ or more. Overall, it is preferred that ρs1$c$/ρssc be about $\frac{1}{10}$ or more and about 9 or less. That is, it is preferred that the first doped layer 31 have a sheet resistance about $\frac{1}{10}$ or more and about 9 times or less that of the subcollector layer 2. This means that if the first doped layer 31 and the subcollector layer 2 have the same impurity concentration, it is preferred that the first doped layer 31 have a thickness about $\frac{1}{9}$ or more and about 10 times or less that of the subcollector layer 2.

At ρs1$c$/ρssc ratios of about 3 or less, ρstot/ρssc changes greatly with a change in ρs1$c$/ρssc and is about 0.75 or less. This means that bringing down ρs1$c$/ρssc to about 3 or less reduces the collector resistance Rc significantly. ρs1$c$/ρssc ratios lower than about $\frac{1}{3}$, however, have little effect in reducing the collector resistance Rc. In this range, the decrease in ρstot/ρssc is modest, from about 0.25 to about 0. Overall, it is preferred that ρs1$c$/ρssc be about $\frac{1}{3}$ or more and about 3 or less. That is, it is preferred that the first doped layer 31 have a sheet resistance about $\frac{1}{3}$ or more and about 3 times or less that of the subcollector layer 2. This means that if the first doped layer 31 and the subcollector layer 2 have the same impurity concentration, it is preferred that the first doped layer 31 have a thickness about $\frac{1}{3}$ or more and about 3 times or less that of the subcollector layer 2.

Furthermore, forming the first doped layer 31 to a thickness similar to the subcollector layer 2 and in contact with the first surface 201, of the subcollector layer 2, as in FIG. 3 places the base electrodes 10 and base layer 4 farther away from the collector electrodes 9, reducing the external capacitances Cbcex1, and also from the subcollector layer 2, reducing the external capacitances Cbcex2. These reductions in the external capacitances Cbcex1 and Cbcex2 lead to a decrease in the overall base-collector capacitance Cbc of the bipolar transistor 100. The bipolar transistor 100 combines a low collector resistance Rc with a low base-collector capacitance Cbc in this way, and offers high output power, high gain, and high efficiency.

Examples

Figure 5:
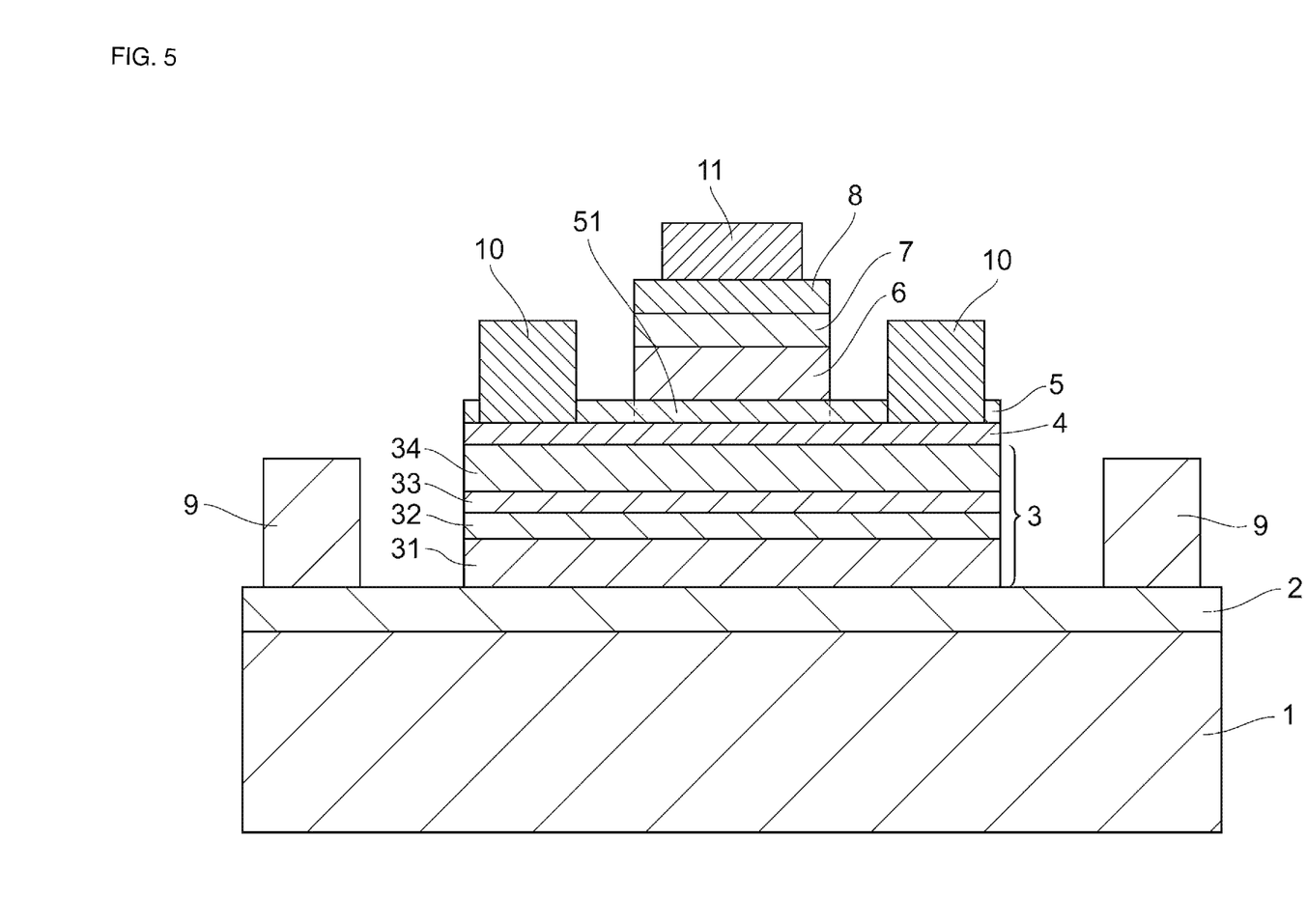
FIG. 5 is a cross-sectional view of the structure of a bipolar transistor according to an example of the present disclosure.

FIG. 5 is a cross-sectional view of the structure of a bipolar transistor 100 according to this example. As illustrated in the drawing, the bipolar transistor 100 has a semi-insulating GaAs substrate 1 and a stack of an n-type GaAs subcollector layer 2, an n-type GaAs collector layer 3, a p-type GaAs base layer 4, and an n-type $In_xGa_{1-x}P$ emitter layer 5 on the substrate 1. The n-type GaAs subcollector layer 2 has an Si concentration of about $2\times10^{18}$ $cm^{-3}$ or more and about $6\times10^{18}$ $cm^{-3}$ or less and a thickness of about 0.3 μm or more and about 1.0 μm or less. The n-type GaAs collector layer 3 has a thickness of about 900 nm or more and about 1500 nm or less. The p-type GaAs base layer 4 has a C concentration of about $2\times10^{19}$ $cm^{-3}$ or more and about $5\times10^{19}$ $cm^{-3}$ or less and a thickness of about 50 nm or more and about 150 nm or less. The n-type $In_xGa_{1-x}P$ emitter layer 5 has a Si concentration of about $2\times10^{17}$ $cm^{-3}$ or more and about $5\times10^{17}$ $cm^{-3}$ or less and a thickness of about 30 nm or more and about 50 nm or less. The proportion of In, x, is about 0.5.

On the n-type $In_xGa_{1-x}P$ emitter layer 5 is a stack of an n-type GaAs layer 6, an n-type $In_xGa_{1-x}As$ grading layer 7, and an n-type $In_xGa_{1-x}As$ contact layer 8. The n-type GaAs layer 6 has a Si concentration of about $2\times10^{18}$ cm$^{-3}$ or more and about $4\times10^{18}$ cm$^{-3}$ or less and a thickness of about 50 nm or more and about 150 nm or less. The n-type $In_xGa_{1-x}As$ grading layer 7 has an Si concentration of about $1\times10^{19}$ cm$^{-3}$ or more and about $3\times10^{19}$ cm$^{-3}$ or less and a thickness of about 30 nm or more and about 70 nm or less. The proportion of In, x, is about 0 on the side closer to the p-type GaAs base layer 4 and about 0.5 on the side farther from the p-type GaAs base layer 4. The n-type $In_xGa_{1-x}As$ contact layer 8 has a Si concentration of about $1\times10^{19}$ cm$^{-3}$ or more and about $3\times10^{19}$ cm$^{-3}$ or less and a thickness of about 30 nm or more and about 70 nm or less. The proportion of In, x, is about 0.5.

The impurity concentration and thickness of the n-type $In_xGa_{1-x}P$ emitter layer 5 are selected so that this layer is depleted of free electrons outside the area beneath the n-type $In_xGa_{1-x}As$ contact layer 8, n-type $In_xGa_{1-x}As$ grading layer 7, and n-type GaAs layer 6. Actually, therefore, current flows only through the intrinsic emitter region 51, the portion of the n-type $In_xGa_{1-x}P$ emitter layer 5 beneath the mesa of the n-type $In_xGa_{1-x}As$ contact layer 8, n-type $In_xGa_{1-x}As$ grading layer 7, and n-type GaAs layer 6. It should be noted that FIGS. 1 and 3 illustrate the emitter layer 5 as if substantially all of it is the intrinsic emitter region. The depleted region of the emitter layer 5 is not illustrated.

The first, second, third, and fourth doped layers 31, 32, 33, and 34, constituting the collector layer 3, are formed integrally into a mesa as a whole. No additional operation is therefore needed to form the first doped layer 31. The first, second, third, and fourth doped layers 31, 32, 33, and 34 are n-type GaAs layers with different impurity concentrations.

Preferably, the first doped layer 31 has an impurity concentration and thickness similar to those of the subcollector layer 2. This reduces the collector resistance Rc in accordance with Rc=(Rscex+Rscin//R1cin)/2. For example, it is preferred that the first doped layer 31 have an impurity concentration of about $1\times10^{18}$ cm$^{-3}$ or more and about $5\times10^{18}$ cm$^{-3}$ or less, such as about $3\times10^{18}$ cm$^{-3}$, and a thickness of about 200 nm or more and about 900 nm or less, such as about 500 nm.

As for the second, third, and fourth doped layers 32, 33, and 34, it is preferred that each have an impurity concentration at least about an order of magnitude smaller than that in the subcollector layer 2. The second doped layer 32 preferably has an impurity concentration of about $3\times10^{16}$ cm$^{-3}$ or more and about $7\times10^{16}$ cm$^{-3}$ or less, such as about $5\times10^{16}$ cm$^{-3}$, and a thickness of about 100 nm or more and about 300 nm or less, such as about 200 nm. The third doped layer 33 preferably has an impurity concentration of about $1\times10^{16}$ cm$^{-3}$ or more and about $4\times10^{16}$ cm$^{-3}$ or less, such as about $1.5\times10^{16}$ cm$^{-3}$, and a thickness of about 100 nm or more and about 300 nm or less, such as about 220 nm. The fourth doped layer 34 preferably has an impurity concentration of about $3\times10^{15}$ cm$^{-3}$ or less, such as about $3\times10^{15}$ cm$^{-3}$, and a thickness of about 300 nm or more and about 500 nm or less, such as about 400 nm.

On the surface of the n-type $In_xGa_{1-x}As$ contact layer 8 is an emitter electrode 11. The emitter electrode 11 is, for example, a Ti (about 50 nm thick)/Pt (about 50 nm thick)/Au (about 200 nm thick) electrode. On the surface of the p-type GaAs base layer 4 is a pair of base electrodes 11 facing each other with the intrinsic emitter region 51 therebetween. The base electrodes 10 are, for example, Ti (about 50 nm thick)/Pt (about 50 nm thick)/Au (about 200 nm thick) electrodes. On the surface of the subcollector layer 2 is a pair of collector electrodes 9 facing each other with the collector layer 3 therebetween. The collector electrodes 9 are, for example, AuGe (about 60 nm thick)/Ni (about 10 nm thick)/Au (about 200 nm thick)/Mo (about 10 nm thick)/Au (about 1 μm thick) electrodes.

The following describes a method for the fabrication of a bipolar transistor 100 with reference to FIGS. 6 to 9.

Figure 6:
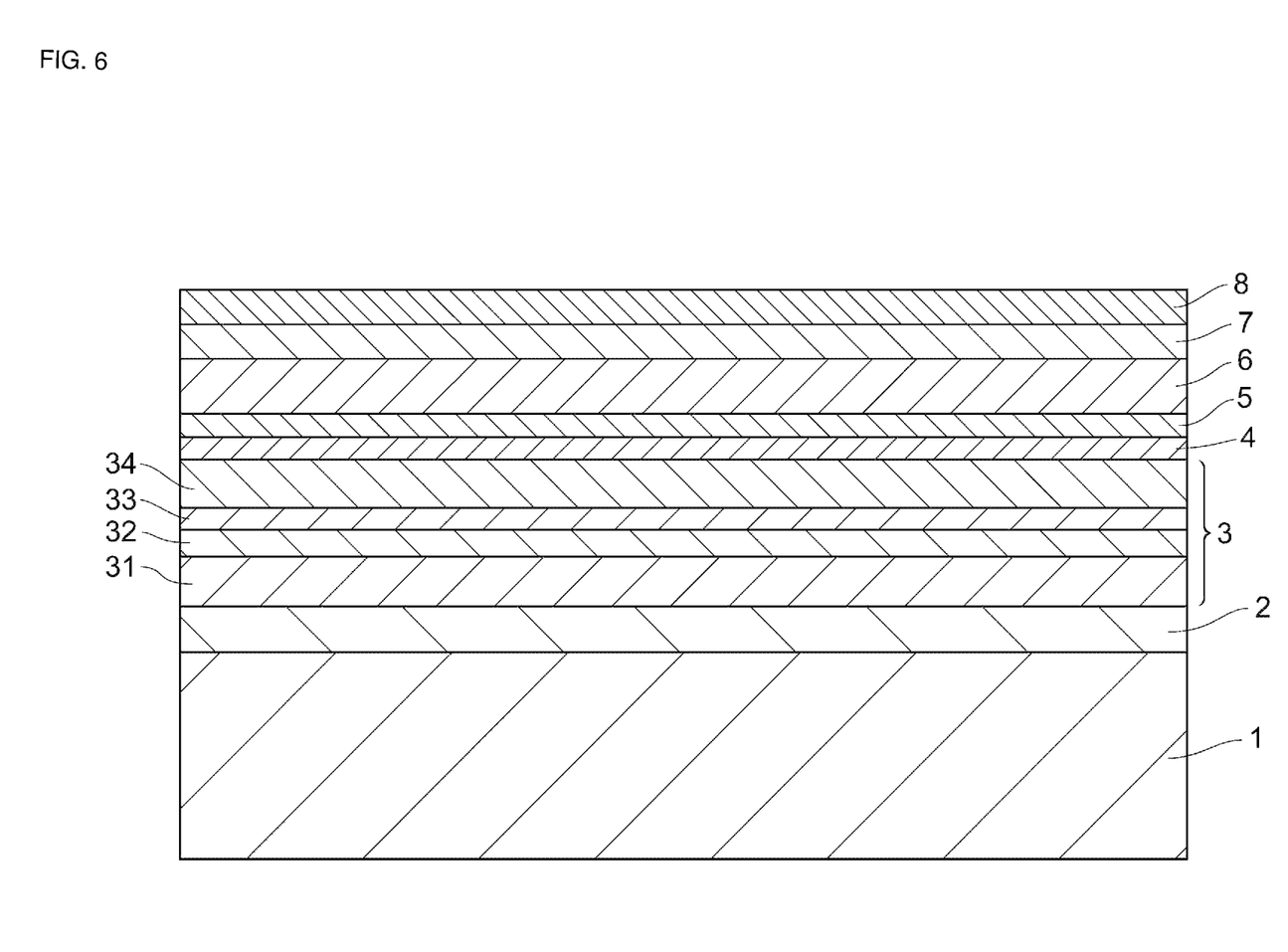
FIG. 6 is a cross-sectional diagram illustrating a method for the fabrication of a bipolar transistor according to an example of the present disclosure.

First, as illustrated in FIG. 6, an n-type GaAs subcollector layer 2 is formed on the surface of a GaAs substrate 1. Then first, second, third, and fourth doped layers 31, 32, 33, and 34 are sequentially formed on the n-type GaAs subcollector layer 2 by the same process, giving an n-type GaAs collector layer 3. This way of forming the first doped layer 31 and the other doped layers 32, 33, and 34, sequentially and by the same process, allows the manufacturer to use an existing fabrication method as it is, requiring no additional operation to form the first doped layer 31. Then a p-type GaAs base layer 4 is formed on the fourth doped layer 34, an n-type $In_xGa_{1-x}P$ emitter layer 5 on the p-type GaAs base layer 4, an n-type GaAs layer 6 on the n-type $In_xGa_{1-x}P$ emitter layer 5, an n-type $In_xGa_{1-x}As$ grading layer 7 on the n-type GaAs layer 6, and an n-type $In_xGa_{1-x}As$ contact layer 8 on the n-type $In_xGa_{1-x}As$ grading layer 7. The individual layers 2 to 8 of the bipolar transistor 100 are formed by an epitaxial process, such as metal-organic chemical vapor deposition. The dopant for n-type semiconductor layers can be, for example, Si, and that for p-type semiconductors can be, for example, C. The n-type $In_xGa_{1-x}As$ contact layer 8 may be doped with Se or Te so that it has a high impurity concentration.

Figure 7:
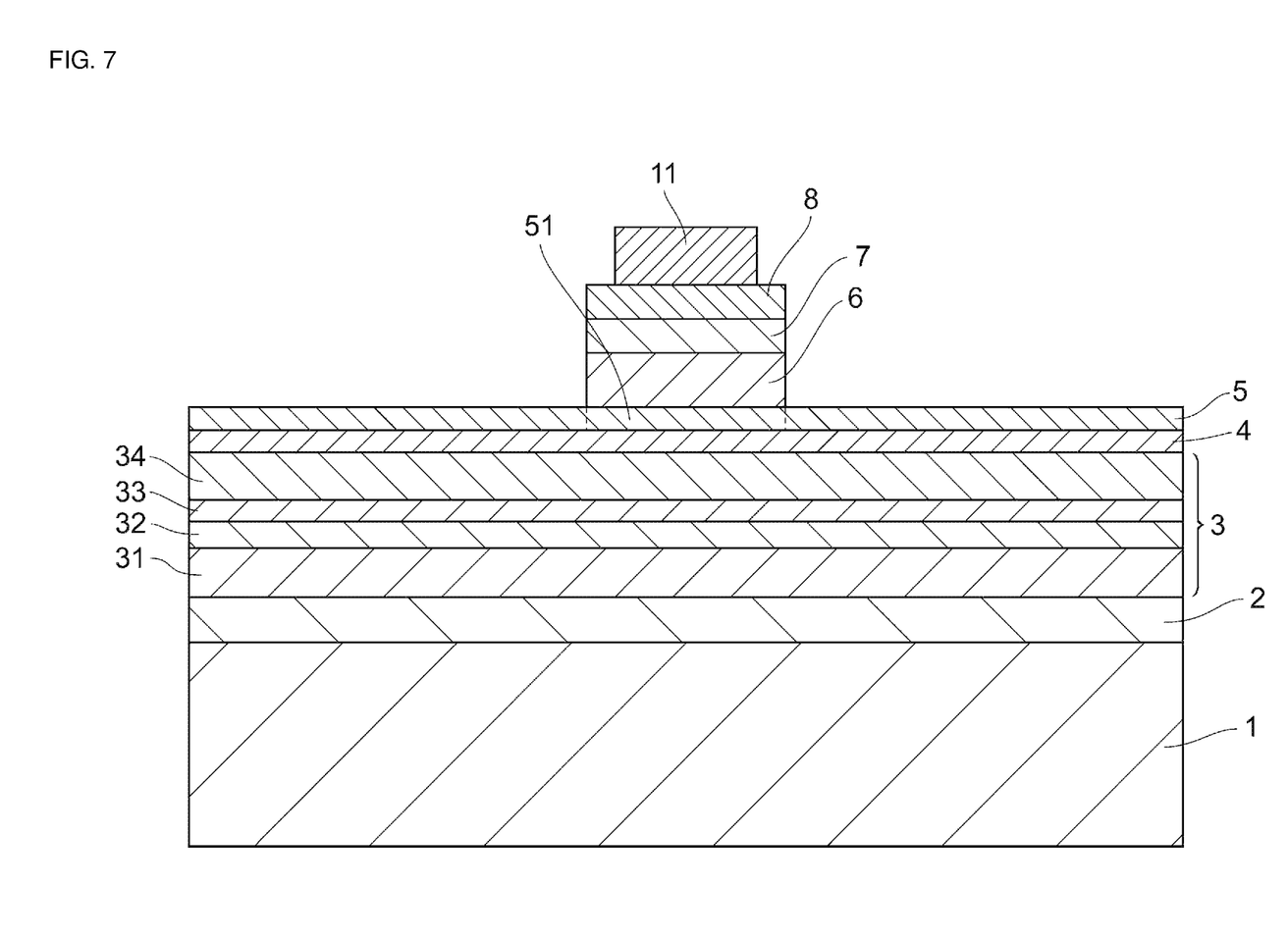
FIG. 7 is a cross-sectional diagram illustrating a method for the fabrication of a bipolar transistor according to an example of the present disclosure.

Then, as illustrated in FIG. 7, an emitter electrode 11 is formed on the surface of the n-type $In_xGa_{1-x}As$ contact layer 8. The n-type $In_xGa_{1-x}As$ contact layer 8, n-type $In_xGa_{1-x}As$ grading layer 7, and n-type GaAs layer 6 are then etched, with the etch mask being a photoresist mask (not illustrated), to leave the portion above the intrinsic emitter region 51 and eliminate the unnecessary rest. As a result, a mesa of the n-type $In_xGa_{1-x}As$ contact layer 8, n-type $In_xGa_{1-x}As$ grading layer 7, and n-type GaAs layer 6 is determined.

Figure 8:
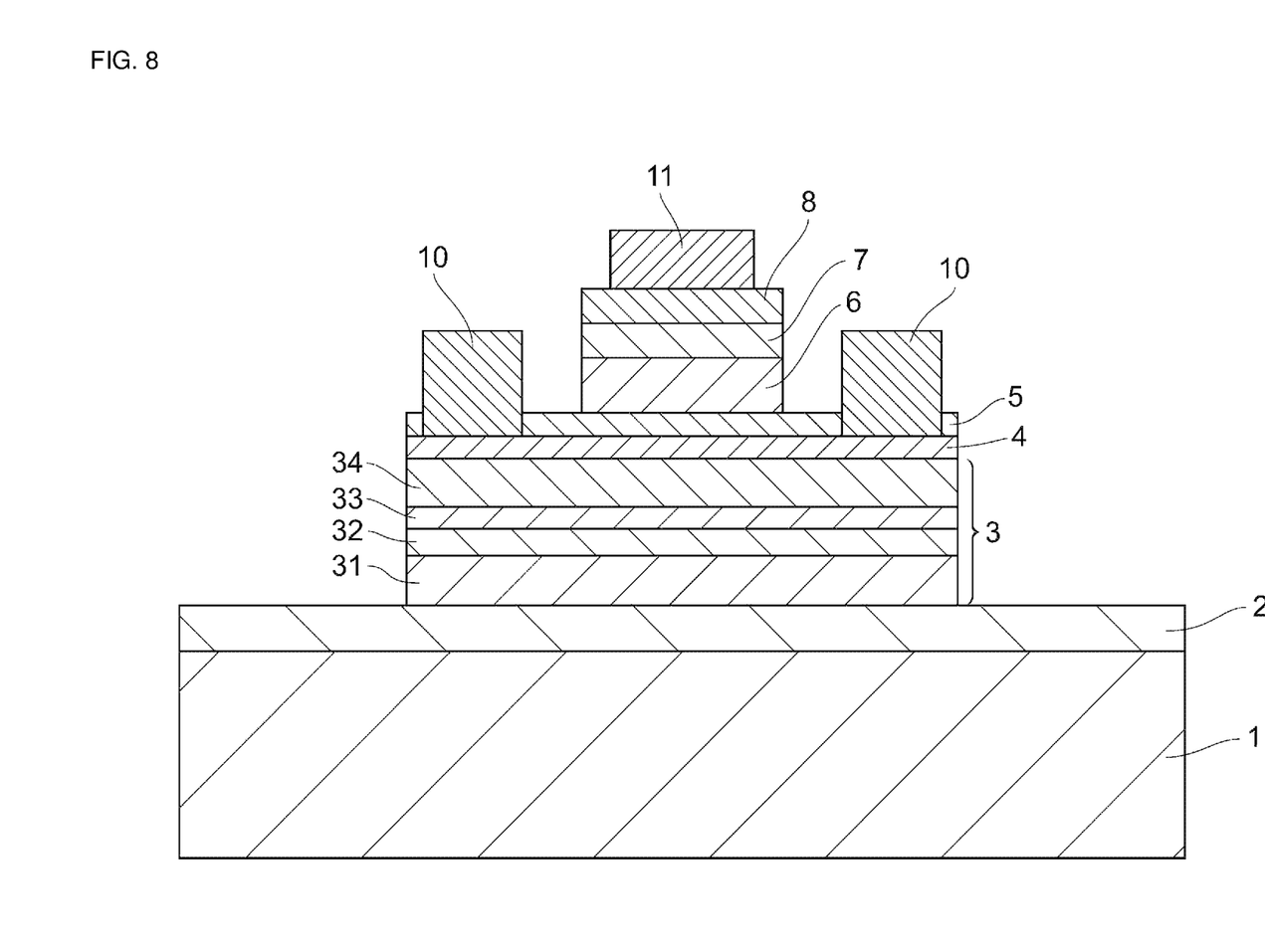
FIG. 8 is a cross-sectional diagram illustrating a method for the fabrication of a bipolar transistor according to an example of the present disclosure.

Then, as illustrated in FIG. 8, the n-type $In_xGa_{1-x}P$ emitter layer 5, p-type GaAs base layer 4, and collector layer 3 are etched, with the etch mask being a photoresist mask (not illustrated), to form a mesa and eliminate the unnecessary portion. The first, second, third, and fourth doped layers 31, 32, 33, and 34 are sequentially etched by the same process, and the resulting doped layers 31, 32, 33, and 34 have substantially the same two-dimensional shape when viewed in the direction in which the doped layers 31, 32, 33, and 34 are stacked. This way of forming the first doped layer 31, into substantially the same two-dimensional shape as the other doped layers 32, 33, and 34, allows the manufacturer to use an existing fabrication method as it is, requiring no additional operation to form the first doped layer 31. The n-type $In_xGa_{1-x}P$ emitter layer 5 is then worked to expose the areas of the p-type GaAs base layer 4 in which base electrodes 10 are to be formed. After that, base electrodes 10 are formed in contact with the p-type GaAs base layer 4 and alloyed to create ohmic contacts.

Figure 9:
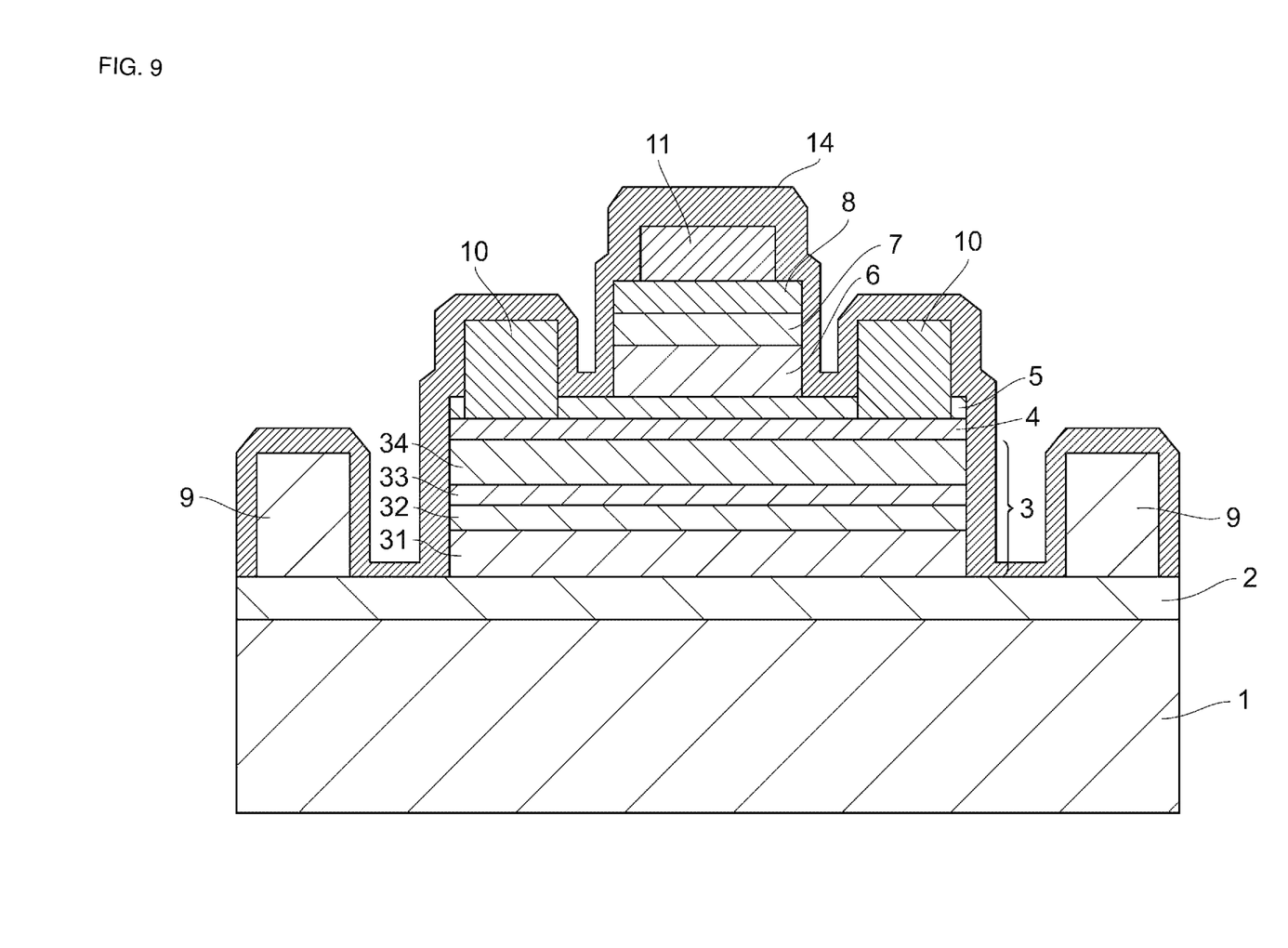
FIG. 9 is a cross-sectional diagram illustrating a method for the fabrication of a bipolar transistor according to an example of the present disclosure.

Then, as illustrated in FIG. 9, collector electrodes 9 are formed in contact with the subcollector layer 2 and alloyed to create ohmic contacts. Lastly, the entire surface of the bipolar transistor 100 is covered with a passivation coating 14, such as a SiN film.

The combination of the materials for the emitter layer and base layer 4 does not need to be InGaP (emitter)/GaAs (base). For the emitter layer 5 and base layer 4, other heterojunction-forming combinations of materials can be also used including AlGaAs (emitter)/GaAs (base), InP (emitter)/InGaAs (base), InGaP (emitter)/InGaAs (base), InGaP (emitter)/GaAsSb (base), InGaP (emitter)/AlGaAs (base), InGaP (emitter)/InGaAsN (base), Si (emitter)/SiGe (base), and AlGaN (emitter)/GaN (base).

Figure 10:
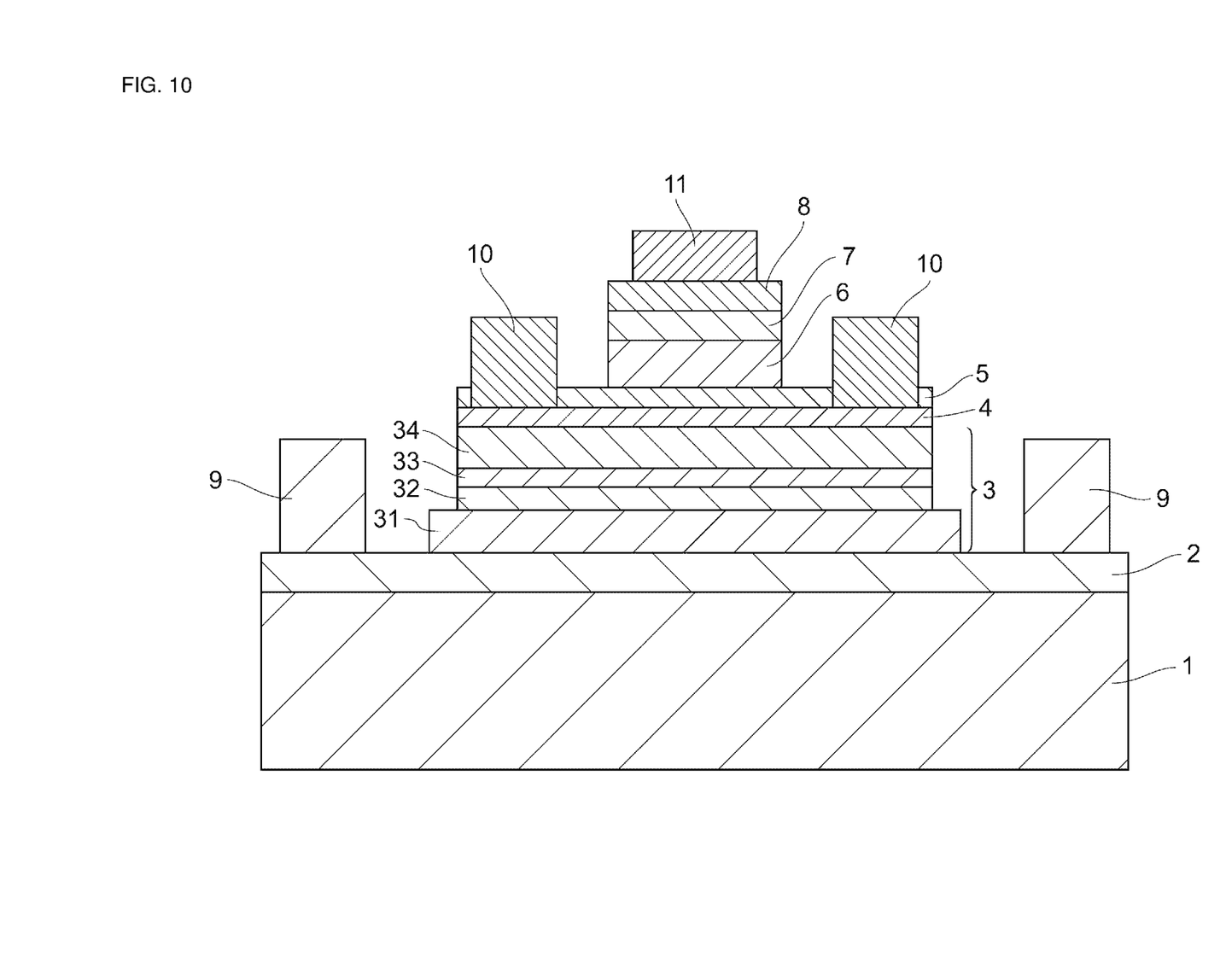
FIG. 10 is a cross-sectional view of the structure of a bipolar transistor according to an example of the present disclosure.

The first doped layer 31 may have, as illustrated in FIG. 10, a two-dimensional shape that extends beyond the edges of the two-dimensional shape of the other doped layers 32, 33, and 34 when viewed in the direction in which the doped layers 31, 32, 33, and 34 are stacked. This increases the area of contact between the subcollector layer 2 and the first doped layer 31, providing a further reduction in collector resistance Rc.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bipolar transistor comprising:
   a subcollector layer having first and second subcollector layer surfaces on opposite sides and collector electrodes on the first subcollector surface;
   a base layer having first and second base layer surfaces on opposite sides and base electrodes on the first base layer surface;
   a collector layer having first and second collector layer surfaces on opposite sides, with the first and second collector layer surfaces in contact with the second base layer surface and the first subcollector layer surface, respectively, and including a plurality of doped layers with graded impurity concentrations, higher on a side of the second collector layer surface and lower on a side of the first collector layer surface; and
   an emitter layer on the first base layer surface, wherein:
   the plurality of doped layers include a first doped layer that has a highest impurity concentration thereamong and is in contact with the first subcollector layer surface; and
   the first doped layer has a sheet resistance less than or equal to about 9 times a sheet resistance of the subcollector layer.

2. The bipolar transistor according to claim 1, wherein the sheet resistance of the first doped layer is more than or equal to about 1/10 of the sheet resistance of the subcollector layer.

3. The bipolar transistor according to claim 1, wherein the sheet resistance of the first doped layer is about 1/3 or more and about 3 times or less the sheet resistance of the subcollector layer.

4. The bipolar transistor according to claim 1, wherein the impurity concentration in the first doped layer is similar to an impurity concentration in the subcollector layer.

5. The bipolar transistor according to claim 1, wherein the first doped layer has a thickness about 1/5 or more and about 10 times or less a thickness of the subcollector layer.

6. The bipolar transistor according to claim 1, wherein the subcollector layer has an impurity concentration of about $1 \times 10^{18}$ cm$^{-3}$ or more.

7. The bipolar transistor according to claim 1, wherein the plurality of doped layers have substantially the same two-dimensional shape when viewed in a direction in which the plurality of doped layers are stacked.

8. The bipolar transistor according to claim 1, wherein the first doped layer has a two-dimensional shape that extends beyond edges of a two-dimensional shape of the other doped layer or layers when viewed in a direction in which the plurality of doped layers are stacked.

9. The bipolar transistor according to claim 1, wherein:
   the plurality of doped layers further include a stack of second, third, and fourth doped layers, from the side of the second collector layer surface to the side of the first collector layer surface, on the first doped layer;
   the second and third doped layers each have an impurity concentration of about $1 \times 10^{16}$ cm$^{-3}$ or more and about $7 \times 10^{16}$ cm$^{-3}$ or less; and
   the fourth doped layer has an impurity concentration of about $3 \times 10^{15}$ cm$^{-3}$ or less.

10. The bipolar transistor according to claim 1, wherein:
    the plurality of doped layers further include a stack of second and third doped layers, from the side of the second collector layer surface to the side of the first collector layer surface, on the first doped layer; and
    the second doped layer has an impurity concentration higher than an impurity concentration in the third doped layer.

11. The bipolar transistor according to claim 10, wherein the impurity concentration in the second doped layer is about $7 \times 10^{16}$ cm$^{-3}$ or less.

12. The bipolar transistor according to claim 1, wherein the emitter and base layers form a heterojunction, and the emitter layer has a band gap greater than a band gap of the base layer.

13. The bipolar transistor according to claim 1, wherein each of the subcollector, collector, emitter, and base layers is a layer of a compound semiconductor.

* * * * *